(12) United States Patent
Nagasawa

(10) Patent No.: US 11,650,445 B2
(45) Date of Patent: May 16, 2023

(54) METHOD FOR MANUFACTURING TRANSPARENT PANEL AND METHOD FOR MANUFACTURING OPTICAL DEVICE

(71) Applicant: DEXERIALS CORPORATION, Tokyo (JP)

(72) Inventor: Yoshikazu Nagasawa, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/644,847

(22) PCT Filed: Sep. 11, 2018

(86) PCT No.: PCT/JP2018/033643
§ 371 (c)(1),
(2) Date: Mar. 5, 2020

(87) PCT Pub. No.: WO2019/054374
PCT Pub. Date: Mar. 21, 2019

(65) Prior Publication Data
US 2021/0088831 A1    Mar. 25, 2021

(30) Foreign Application Priority Data

Sep. 15, 2017   (JP) .............................. JP2017-178418

(51) Int. Cl.
*G02F 1/1333* (2006.01)
*G02F 1/1335* (2006.01)
(Continued)

(52) U.S. Cl.
CPC .. *G02F 1/133354* (2021.01); *G02F 1/133388* (2021.01); *G02F 1/133512* (2013.01);
(Continued)

(58) Field of Classification Search
CPC ......... G02F 1/133354; G02F 1/133351; H01L 27/1259; G03F 7/00; B32B 2457/20; G06F 2203/04103; B05D 1/00; C23C 14/00
See application file for complete search history.

(56) References Cited

U.S. PATENT DOCUMENTS 5,866,281 A * 2/1999 Guckel ................... G03F 7/094
430/22
9,673,426 B2    6/2017 Wu
(Continued)

FOREIGN PATENT DOCUMENTS

| CN | 203890287 U | 10/2014 |
|---|---|---|
| CN | 104332450 A | 2/2015 |

(Continued)

OTHER PUBLICATIONS

Dec. 15, 2020, Japanese Office Action issued for related JP Application No. 2017-178418.
(Continued)

*Primary Examiner* — Mariam Qureshi
(74) *Attorney, Agent, or Firm* — Paratus Law Group, PLLC

(57) ABSTRACT

Provided are a method for manufacturing a transparent panel formed with a wall member having high accuracy, a uniform height from a surface to adhere to an optical member, and smoothness. This method comprises: a step of preparing a transparent panel 4 for an optical device 1 to be bonded to an optical member 2; a step of forming a mask layer 15 so as to form an opening 6 along a periphery of an outer shape of the transparent panel 4; a step of applying a curable resin material 7 to the opening 6 and the mask layer 15; a step of pressing a flat plate 10 against the curable resin material 7; a step of curing the resin composition 7 to form a cured resin layer 11; a step of detaching the flat plate 10; and a step of
(Continued)

removing the mask layer 15 together with the cured resin layer 11 formed on the mask layer 15 to obtain a wall member 12 along the periphery of the outer shape of the transparent panel 4.

22 Claims, 14 Drawing Sheets

(51) Int. Cl.
    *H01L 51/00*     (2006.01)
    *H01L 51/56*     (2006.01)

(52) U.S. Cl.
    CPC ...... *H01L 51/0016* (2013.01); *H01L 51/0096* (2013.01); *H01L 51/56* (2013.01); *G02F 2201/56* (2013.01); *G02F 2203/01* (2013.01)

(56) References Cited

U.S. PATENT DOCUMENTS

| | | | |
|---|---|---|---|
| 2009/0135150 A1* | 5/2009 | Takashima | B32B 27/08 345/173 |
| 2010/0154992 A1* | 6/2010 | Feinstein | B23K 26/57 156/711 |
| 2012/0263964 A1 | 10/2012 | Toyoda et al. | |
| 2013/0224425 A1* | 8/2013 | Yamazaki | B32B 38/0008 428/78 |
| 2015/0083340 A1* | 3/2015 | Price | B26D 1/547 156/701 |
| 2015/0212350 A1* | 7/2015 | Niiyama | B32B 3/08 349/122 |
| 2016/0002501 A1 | 1/2016 | Niiyama et al. | |
| 2017/0075444 A1* | 3/2017 | Nade | H04M 1/0268 |

FOREIGN PATENT DOCUMENTS

| | | |
|---|---|---|
| JP | 2012-158688 A | 8/2012 |
| JP | 2015-052795 A | 3/2015 |
| JP | 2015-226204 A | 12/2015 |
| JP | 2016-017119 A | 2/2016 |
| KR | 2002-0068798 A | 8/2002 |
| TW | 201421114 A | 6/2014 |
| WO | WO 2014/061607 A1 | 4/2014 |
| WO | WO 2016/074917 A1 | 5/2016 |

OTHER PUBLICATIONS

Dec. 26, 2020, Korean Office Action issued for related KR application No. 10-2019-7036000.
Feb. 26, 2021, European Search Report issued for related EP application No. 18856876.0.
Apr. 22, 2021, Chinese Office Action issued for related CN application No. 201880056462.1.
Apr. 29, 2022, Taiwanese Office Action issued for related TW Application No. 107132239.
Feb. 23, 2023, Taiwanese Office Action issued for related TW Application No. 107132239.

* cited by examiner

METHOD FOR MANUFACTURING TRANSPARENT PANEL AND METHOD FOR MANUFACTURING OPTICAL DEVICE

CROSS REFERENCE TO PRIOR APPLICATION

The present disclosure relates to a method for manufacturing a transparent panel such as a protective sheet bonded to a display surface side of an optical member such as a liquid crystal display panel, and a method for manufacturing an optical device in which the transparent panel is bonded to an optical member via a cured resin layer. This application is a National Stage Patent Application of PCT International Patent Application No. PCT/JP2018/033643 filed on Sep. 11, 2018 under 35 U.S.C. § 371, which claims priority on the basis of Japanese Patent Application No. 2017-178418 filed in Japan on Sep. 15, 2017, which are all hereby incorporated by reference in their entirety.

TECHNICAL FIELD

The present disclosure relates to a method for manufacturing a transparent panel such as a protective sheet bonded to a display surface side of an optical member such as a liquid crystal display panel, and a method for manufacturing an optical device in which the transparent panel is bonded to an optical member via a cured resin layer. This application claims priority on the basis of Japanese Patent Application No. 2017-178418 filed in Japan on Sep. 15, 2017, which is incorporated into the present application by reference.

BACKGROUND ART

An optical device such as a liquid crystal display device, which is conventionally used as an information terminal such as a smart phone or a car navigation device, is provided with a light-transmissive cured resin layer between an optical member such as a liquid crystal display panel and a transparent panel for protecting the optical member for the purpose of reducing the thickness and improving visibility.

As a method for forming the cured resin layer, for example, there has been known a method in which a curable resin composition is applied to a transparent panel to form a curable resin layer, an optical member such as a liquid crystal display panel or an organic EL panel is laminated via the curable resin layer, and then the curable resin layer is cured (PLT 1).

As a method for applying the curable resin composition to the transparent panel, there has been used a method such as ejecting the curable resin composition from a moving slit nozzle to the surface of the transparent panel over the entire width, or applying the curable resin composition by screen printing.

CITATION LIST

Patent Literature

PLT 1: Japanese Unexamined Patent Application Publication No. 2015-52795

SUMMARY OF INVENTION

Technical Problem

Recently, a transparent panel curved in one direction has been proposed in order to improve the design and touch feeling of an optical device. For such a curved transparent panel, in order to prevent the curable resin composition from protruding out when the curable resin composition is applied to the transparent panel or when the transparent panel and the optical member are bonded to each other, a method has been proposed in which a wall member is formed on the periphery of a transparent panel curved in a concave shape by using a dispenser and then a curable resin composition is supplied to the surface of the transparent panel.

When the wall member for preventing the protrusion of the curable resin composition is projected onto a display region such as a liquid crystal display panel through a transparent panel, the visibility of the optical device is impaired, and therefore, high positional accuracy and dimensional accuracy of the wall member are required in the formation on the periphery of the transparent panel. Furthermore, if the height and smoothness of the upper surface of the wall member serving as the bonding surface to the optical member vary, the curable resin composition might protrude when the wall member is bonded to the optical member, and therefore uniform height and smoothness with respect to the bonding surface of the optical member over the entire length are required.

Although such a demand for the wall member is similarly required in a curved panel having a concave or convex curved side, it is difficult to realize such a demand in a short time and at a low cost for mass production because of high machining difficulty.

Accordingly, it is an object of the present disclosure to provide a method for manufacturing a transparent panel provided with a wall member having a uniform height and smoothness with respect to a bonding surface to an optical member with high precision, and a method for manufacturing an optical device using the transparent panel.

Solution to Problem

In order to solve the aforementioned problems, a method for manufacturing a transparent panel according to the present disclosure includes: a step of preparing a transparent panel for an optical device to be bonded to an optical member; a step of forming a mask layer so as to form an opening along a periphery of an outer shape of the transparent panel; a step of applying a curable resin material to the opening and the mask layer; a step of pressing a flat plate against the curable resin material; a step of curing the curable resin material to form a cured resin layer; a step of detaching the flat plate; and a step of removing the mask layer together with the cured resin layer formed on the mask layer to obtain a wall member along the periphery of the outer shape of the transparent panel.

In addition, the method for manufacturing an optical device according to the present disclosure includes: a step of holding a transparent panel manufactured by using the above-described method and an optical member so as to face each other, bringing the wall member into close contact with a bonding surface of the optical member, and obtaining a laminate in which a curable resin composition is held in a hollow portion surrounded by the wall member; and a step of curing the curable resin composition.

Advantageous Effects of Invention

According to the present disclosure, the upper surface of the transparent panel is formed flat by defining the width of the wall member by the width of the opening, defining the height of the wall member by the pressing height of the flat plate, and curing the wall member while being pressed by the flat plate. Accordingly, it is possible to manufacture a transparent panel provided with a wall member having a uniform height and smoothness with respect to a bonding surface adhered to an optical member with high precision, and an optical device using the transparent panel.

DESCRIPTION OF EMBODIMENTS

Figure 1A:
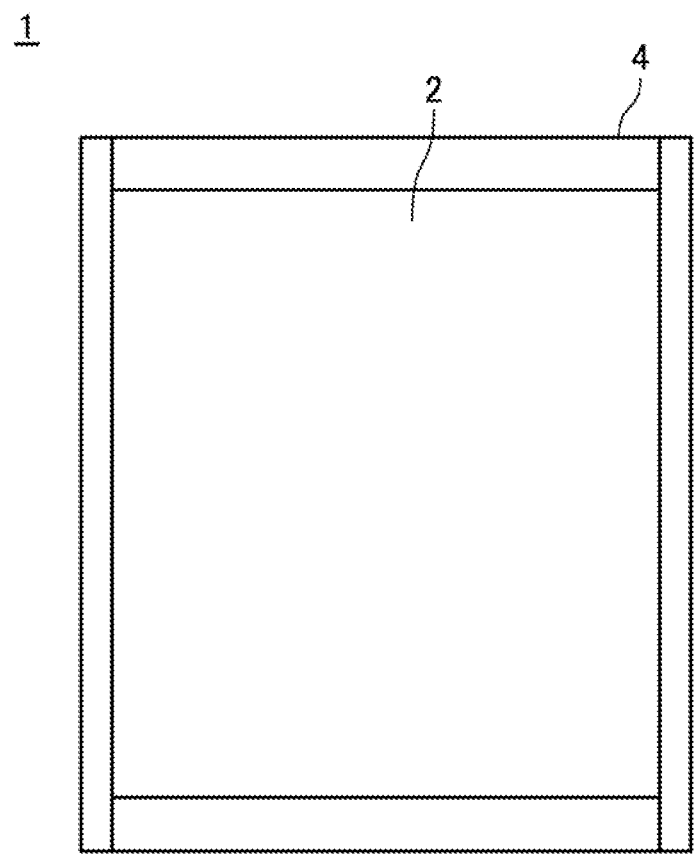
FIG. 1(A) is a rear view showing an optical device from an optical member side.

Hereinafter, a method for manufacturing a transparent panel and a method for manufacturing an optical device according to the present disclosure will be described in detail with reference to the drawings. It should be noted that the present disclosure is not limited to the following embodiments and various modifications can be made without departing from the scope of the present disclosure. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

Optical Device 1

The present disclosure provides a method for manufacturing a transparent panel 4 for an optical device which is bonded to an optical member 2 via a cured resin layer 3 to form an optical device 1, and a method for manufacturing an optical device 1 using the transparent panel 4. Prior to the description of the methods for manufacturing the transparent panel 4 and the optical device 1, the configuration of the optical device 1 will be described.

Figure 1B:
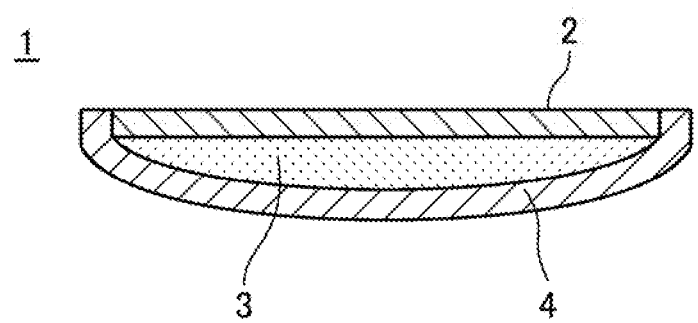
FIG. 1(B) is a cross-sectional view of the optical device.

The optical device 1 is an optical device such as a liquid crystal display panel and an organic EL display panel and is used for various information terminals and information devices such as a smart phone, a car navigation system, and an instrument panel, among others. As shown in FIGS. 1(A) and 1(B), in order to make the optical device 1 thinner and to improve visibility, a light-transmissive cured resin layer 3 is provided between an optical member 2 such as a liquid crystal display panel and a transparent panel 4 for protecting the optical member 2.

Transparent Panel 4

The transparent panel 4 is light-transmissive and laminated with the optical member 2 through the cured resin layer 3 to cover and protect the display surface of the optical member 2 while ensuring the visibility of the optical member 2.

The material of the transparent panel 4 may be any material as long as the material is light transmissive such that an image formed on the optical member can be seen, the material including glass or a resin material such as an acrylic resin, polyethylene terephthalate, polyethylene naphthalate, and polycarbonate. These materials may be subjected to single or double sided hard coating processing and anti-reflection processing, for example. When the optical member 2 described later is a touch panel, a part of the member of the touch panel may be used as the transparent panel 4.

Figure 2:
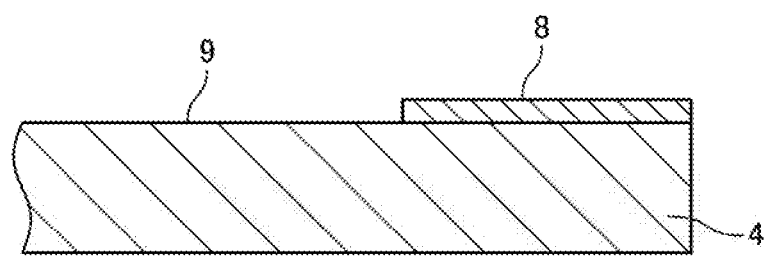
FIG. 2 is a cross-sectional view showing a periphery of a transparent panel having a light shielding portion formed thereon.

In addition, as shown in FIG. 2, in the transparent panel 4, a black frame-shaped light shielding portion 8 called a black matrix is formed in a region corresponding to the periphery of the display region of the optical member 2 in order to improve the brightness and contrast of the display image. In the transparent panel 4, the inside of the light shielding portion 8 serves as a display portion 9 through which the display region of the optical member 2 is transmitted.

The light shielding portion 8 is formed to have a uniform thickness by applying a paint colored black or the like by a screen printing method or the like, and drying and curing the paint. The thickness of the light shielding portion 8 is usually 5 to 100 μm.

The shape of the transparent panel 4 is not particularly limited, and may be, for example, a flat shape, a shape curved in one direction as shown in FIG. 1(B), a paraboloid of revolution, a hyperbolic paraboloid, or another quadratic curved shape, and a part of the curved shape and the quadratic curved shape may have a flat portion.

It should be noted that dimensional characteristics such as the shape and thickness of the curvature of the cover member and physical properties such as elasticity can be appropriately determined in accordance with the purpose of use.

Wall Member 12

Figure 11:
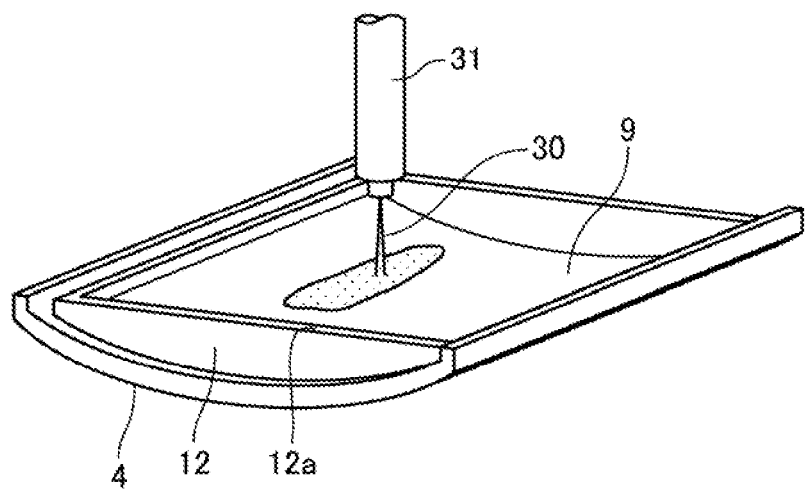
FIG. 11 is a perspective view showing a step of applying a curable resin composition constituting a curable resin layer to a display portion of a transparent panel provided with a wall member.

As shown in FIG. 11, the transparent panel 4 is provided with a wall member 12 formed along a periphery of the outer shape on a bonding surface with the optical member 2. The wall member 12 prevents the curable resin composition 30, which will be described later, from protruding. The wall member 12 is formed on at least two opposing sides of the transparent panel 4 formed in a rectangular shape in plan view, and is preferably formed over the entire circumference of the transparent panel 4.

Even when formed on the side having the curvature of the transparent panel 4, the wall member 12 has high dimensional accuracy and positional accuracy, and uniform height and smoothness with respect to the bonding surface of the optical member 2 are ensured. Therefore, not to mention the case of a flat panel, even when the transparent panel 4 is formed as a curved panel, the wall member 12 does not protrude into the display region of the optical member 2 when the transparent panel 4 is bonded to the optical member 2, and the visibility of the optical device 1 is not impaired. Further, the transparent panel 4 can prevent the resin composition 30 from protruding out when it is bonded to the optical member 2. The manufacturing process of the transparent panel 4 having this wall member 12 will be described later in detail.

Optical Member 2

The optical member 2 may be, for example, an image display member such as a liquid crystal display panel, an organic EL display panel, a plasma display panel, or a touch panel. Here, the touch panel means an image display/input panel that combines a display element such as a liquid crystal display panel and a position input device such as a touch pad. The surface shape of the optical member 2 on the transparent panel 4 side is not particularly limited, but is preferably flat. Moreover, a polarizing plate may be arranged on the surface of the optical member 2.

Cured Resin Layer

The cured resin layer 3 interposed between the transparent panel 4 and the optical member 2 has, for example, a light transmitting property, and allows visual recognition of an image displayed on the optical member 2 such as an image display member.

Examples of the curable resin composition 30 constituting the cured resin layer 3 include thermosetting resins and photocurable resins. Although a photocurable resin composition will be described below as an example of the curable resin composition 30, a thermosetting resin composition can also be used in the present disclosure. The photocurable resin composition is in a liquid state, and specifically, has a viscosity of 0.01 to 100 Pa*s (25° C.) with a cone-plate viscometer.

The photocurable resin composition preferably contains a base component (component (a)), an acrylate-based monomer component (component (b)), a plasticizer component (component (c)), and a photopolymerization initiator (component (d)).

Component (a)

The base component (a) is a film-forming component of the cured resin layer 3 having optical transparency and contains at least one of an elastomer and an acrylic oligomer. Both may be used in combination as component (a).

Preferred examples of the elastomer include acrylic copolymer consisting of acrylic ester, polybutene, and polyolefin, among others. The weight average molecular weight of the acrylic ester copolymer is preferably 5,000 to 500,000, and the repetition number n of the polybutene is preferably 10 to 10,000.

Preferred examples of acrylic oligomer include (meth) acrylate oligomer having a backbone of polyisoprene, polyurethane, or polybutadiene, among others. As used herein, the term "(meth) acrylate" includes acrylate and methacrylate.

Preferred examples of (meth) acrylate oligomers having a polyisoprene backbone include esterified product of maleic anhydride adduct of polyisoprene polymer and 2-hydroxyethyl methacrylate UC102 (KURARAY) (molecular weight in terms of polystyrene: 17,000), UC203 (KURARAY) (molecular weight in terms of polystyrene: 35,000), and UC-1 (KURARAY) (molecular weight about 25,000).

Preferred examples of the (meth) acrylic-type oligomers having a polyurethane backbone include aliphatic urethane acrylate (EBECRYL 230 (Daicel-Cytec) (molecular weight of 5,000) and UA-1 (Light Chemical), among others.

For (meth) acrylate oligomer having a polybutadiene backbone, known oligomer may be employed.

Component (b)

The acrylic monomer component (b) is used as a reactive diluent in order to impart sufficient reactivity and coatability to the photocurable resin composition in the manufacturing process of the optical device. Examples of such acrylic monomers include 2-hydroxypropyl methacrylate, benzyl acrylate, and dicyclopentenyloxyethyl methacrylate, among others.

It should be noted that the total content of the base component (a) and the acrylic monomer component (b) in the photocurable resin composition is preferably 25 to 85% by mass.

Component (c)

The plasticizer component (c) is used to impart a buffer property to the cured resin layer and to reduce the cure shrinkage of the photocurable resin composition, and does not react with the acrylate oligomer component of a component (a) and the acrylic monomer component of a component (b) during irradiation of an ultraviolet-ray. Such plasticizer components contain a solid tackifier (1) and a liquid oil component (2).

Examples of the solid tackifier (1) include: terpene-based resins such as terpene resin, terpene phenol resin, and hydrogenated terpene resin; rosin-based resins such as natural rosin, polymerized rosin, rosin ester, and hydrogenated rosin; and terpene-based hydrogenated resins, among others. In addition, non-reactive oligomers obtained by low molecular weight polymerizing the above-mentioned acrylic monomers in advance can also be used; specifically, copolymers of butyl acrylate and 2-hexyl acrylate and acrylic acid, or copolymers of cyclohexyl acrylate and methacrylic acid can be used.

The liquid oil component (2) may contain a polybutadiene type oil or a polyisoprene type oil.

The content of the plasticizer component (c) in the photocurable resin composition is preferably 10 to 65% by mass.

Component (d)

As the photopolymerization initiator designated as the component (d), known photo radical polymerization initiators can be used, which include 1-hydroxy-cyclohexyl phenyl ketone (IRGACURE 184, Ciba Specialty Chemicals), 2-hydroxy-1-{4-[4-(2-hydroxy-2-methyl-propionyl)benzyl]phenyl}-2-methyl-1-propan-1-one (IRGACURE 127, Ciba Specialty Chemicals), benzophenone, and acetophenone, among others.

Insufficient amount of such a photopolymerization initiator relative to 100 parts by mass in total of the base component (a) and the acrylic monomer component (b) result in insufficient curing at the time of ultraviolet irradiation and excessive amount tends to cause problems of foaming since cleavage will increase outgassing; the amount, therefore, is preferably 0.1 to 5 parts by mass, and more preferably 0.2 to 3 parts by mass.

The photocurable resin composition can also contain a chain transfer agent for the purpose of adjusting the molecular weight. For example, 2-mercaptoethanol, lauryl mercaptan, glycidyl mercaptan, mercaptoacetic acid, 2-ethylhexyl thioglycolate, 2,3-dimethyl capto-1-propanol, and α-methylstyrene dimer may be used.

The photocurable resin composition may further contain, if necessary, a general additive such as an adhesion improving agent such as a silane coupling agent and an antioxidant. Further, with regard to the components (a) to (d) of the photocurable resin composition, the components (a) may not be used if appropriate components (b) and (c) are employed.

Manufacturing Process

First Manufacturing Process

Next, a first manufacturing process for manufacturing the transparent panel 4 for the optical device 1 will be described. The first manufacturing process comprises: a step (A) of preparing a transparent panel 4; a step (B) of forming a mask layer so as to form an opening 6 along a periphery of an outer shape of the transparent panel 4; a step (C) of applying a curable resin material 7 to the opening 6 and the mask layer; a step (D) of pressing a flat plate 10 against the curable resin material 7; a step (E) of curing the curable resin material 7 to form a cured resin layer 11; a step (F) of detaching the flat plate 10; and a step (G) of removing the mask layer together with the cured resin layer 11 formed on the mask layer to obtain a wall member 12 along the periphery of the outer shape of the transparent panel 4.

Step A

First, the transparent panel 4 is prepared. As described above, the transparent panel 4 is provided with the light shielding portion 8 formed on one surface to which the optical member 2 is bonded.

Step B

Figure 3:
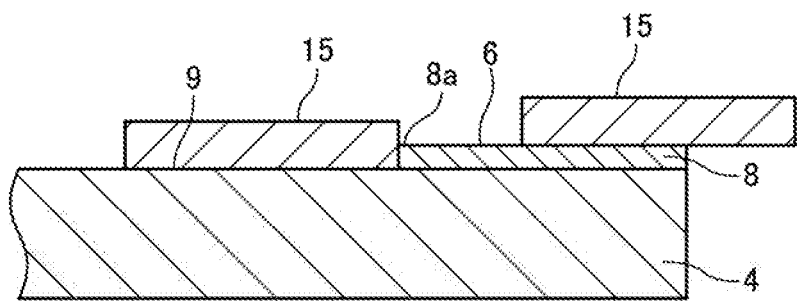
FIG. 3 is a cross-sectional view showing a periphery of a transparent panel to which a masking tape is attached as a mask layer.

Next, a mask layer is formed so as to form an opening 6 along the periphery of the outer shape of the transparent panel 4. The mask layer can be formed using a masking tape comprising a base film having flexibility and an adhesive layer laminated on the base film. For example, as shown in FIG. 3, the mask layer can be formed by attaching two masking tapes 15 along the periphery of the outer shape of the transparent panel 4 and at a predetermined gap. A region between these two masking tapes 15 forms an opening 6 in which a wall member 12 is formed.

The opening 6 is preferably formed on the light shielding portion 8 of the transparent panel 4. Thus, the wall member 12 is formed on the light shielding portion 8, and the curable resin composition 30 can be filled over the entire display portion 9 of the transparent panel 4. In addition, by attaching one of the two masking tapes 15 on the display portion 9 along the boundary with the light shielding portion 8 and attaching the other tape on the light shielding portion 8 with a predetermined gap from the inner edge 8a to form the opening 6, the wall member 12 can be formed along the inner edge 8a of the light shielding portion 8.

In the transparent panel 4, auxiliary tapes for preventing the curable resin material 7 from flowing out may be attached to both ends in the longitudinal direction of the masking tape 15 attached along the periphery of the outer shape. As a result, in the mask layer, the opening 6 is surrounded by the two masking tapes 15 and the two auxiliary tapes and the wall member 12 can be formed in a substantially uniform shape up to the end of the periphery of the outer shape of the transparent panel 4. Further, by attaching the auxiliary tape, it is possible to prevent the curable resin material 7 from flowing out and adhering to an undesirable place when the curable resin material 7 is supplied to the mask layer and the curable resin material 7 is pressed against the flat plate 10.

When it is not necessary to form the wall member 12 of the transparent panel 4 in a uniform shape up to the end portion of the periphery of the outer shape of the transparent panel 4, the auxiliary tape may be omitted. In this case, although both ends of the opening 6 are open, the flow out of the curable resin material 7 can be prevented by reducing the amount of the curable resin material 7 supplied at both ends of the opening 6.

The mask layer is formed on at least two opposing sides of the outer periphery of the transparent panel 4 formed in a rectangular shape. When the transparent panel 4 has a curvature on at least two opposing sides such as a curved surface panel curved in one direction, it is preferable to form the mask layer on two sides having the curvature.

The mask layer may be formed on four sides of the transparent panel 4 formed in a rectangular shape. In this case, the mask layer may be formed such that the two masking tapes 15 to be attached to the respective sides have a length that does not overlap with the ends of the masking tapes 15 attached to the adjacent sides to form a non-continuous opening 6 opened at both ends.

Alternatively, the mask layer may be formed such that both ends of the openings 6 on the adjacent sides are continuous. For example, by forming the two masking tapes attached to the respective sides of the transparent panel 4 with a length overlapping with the ends of the masking tapes 15 attached to the adjacent sides, and attaching the masking tapes 15 while adjusting the attaching position, the masking tapes 15 on the respective adjacent sides can be continued and both ends of the openings 6 on the adjacent sides can be continued. Moreover, instead of attaching the masking tapes 15 on the inside of each side of the transparent panel 4, one rectangular film may be attached, and outer masking tapes 15 facing each side of the rectangular film is attached so as to overlap with the adjacent outer masking tapes 15, whereby both ends of the opening 6 on the adjacent side can be made continuous.

Further, the opening 6 may be formed by using one masking tape 15 having a predetermined opening as the mask layer and attaching the one masking tape 15 having the opening along the periphery of the outer shape of the transparent panel 4.

As described later, the masking tape 15 is released from the transparent panel 4 together with the cured resin layer 11 formed by curing the curable resin material 7. Therefore, the base film of the masking tape 15 is required to have a rigidity capable of breaking the cured resin layer 11. In addition, when the masking tape 15 is released from the transparent panel 4, it is preferable that no adhesive remains in the light shielding portion 8 of the transparent panel 4 and the display portion 9.

Step C

Figure 4:
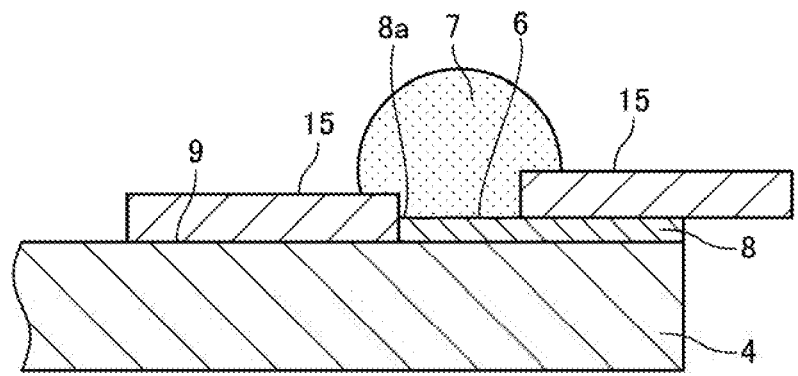
FIG. 4 is a cross-sectional view of the periphery of a transparent panel in which a curable resin material is applied to an opening and masking tapes.

Next, as shown in FIG. 4, the curable resin material 7 is applied to the opening 6 and the mask layer (masking tape 15) of the transparent panel 4. The curable resin material 7 is preferably the same as the curable resin composition 30 to be applied to the display portion 9. The curable resin material 7 can be applied by using a known resin supply method such as application by a dispenser or printing, among other methods. At this time, according to the present disclosure, since the curable resin material 7 can be supplied so as to protrude from the opening 6 onto the mask layer (masking tape 15), a sufficient amount of the curable resin material 7 for forming the wall member 12 on the opening 6 can be supplied, and the dimensional accuracy of the wall member 12 in the width direction can be ensured by the mask layer (masking tape 15).

Step D

Figure 5:
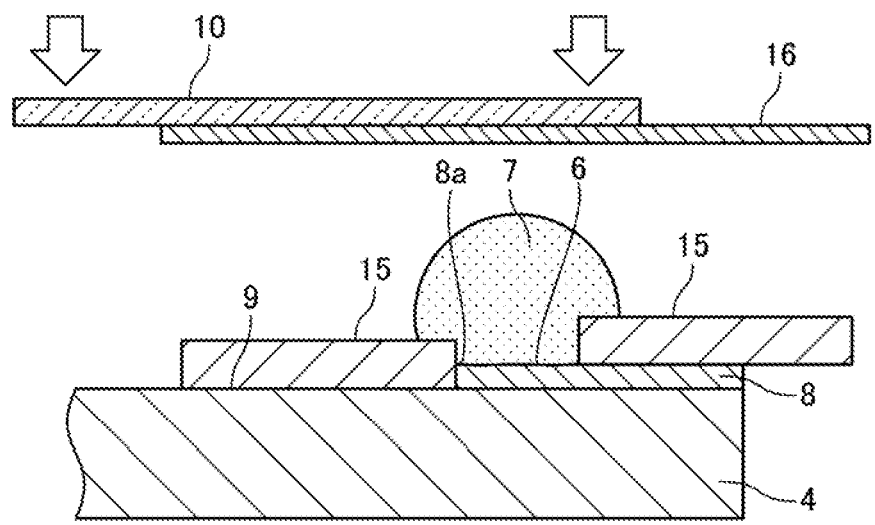
FIG. 5 is a cross-sectional view showing a step of pressing a flat plate, to which a release film is bonded, against a curable resin material.
Figure 6:
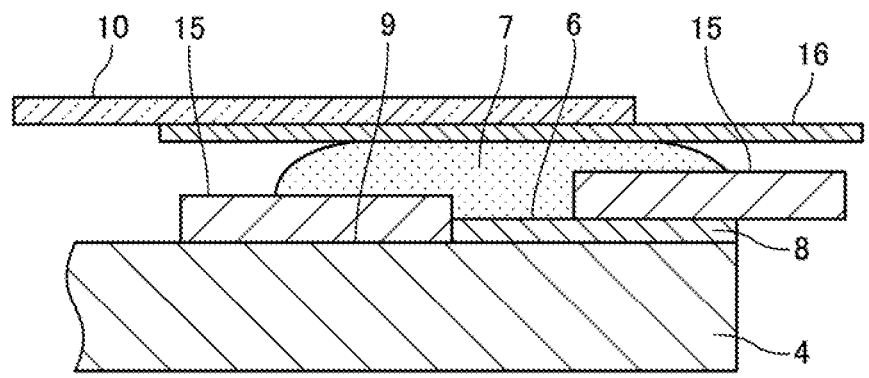
FIG. 6 is a cross-sectional view showing a state in which a flat plate, to which a release film is bonded, is pressed against a curable resin material.

Next, as shown in FIGS. 5 and 6, a flat plate 10 is pressed against the curable resin material 7 supplied to the opening 6 and the mask layer (masking tape 15). Thus, the height of the wall member 12 formed in the opening 6 can be controlled to the bonding height of the predetermined optical member 2, and the upper surface 12a of the wall member 12 can be flattened. According to the present disclosure, even if the transparent panel 4 is a curved panel curved in one direction, the wall member 12 having the upper surface 12a flat with respect to the optical member 2 can be formed.

As the flat plate 10, any member may be used as long as the member has a rigidity capable of adjusting the height with respect to the curable resin material 7 and of flattening the upper surface. Further, by using a light transmitting material such as a glass material and a plastic material, the flat plate 10 can be irradiated with curing light from above the flat plate 10 and a photocurable material can be used as a curable resin material 7. It should be noted that the flat plate 10 does not need to have light transmitting property when a thermosetting material is used as the curable resin material 7.

The flat plate 10 is preferably flexible enough to be easily released from the cured resin layer 11 formed by curing the curable resin material 7. Alternatively, as shown in FIG. 5, a release film 16 for assisting the release from the cured resin layer 11 may be interposed between the flat plate 10 and the curable resin material 7. By interposing the release film 16, the flat plate 10 can be easily removed from the release film 16, and the flexible release film 16 can be easily released from the cured resin layer 11.

As the release film 16, for example, a resin film such as PET (polyethylene terephthalate) film subjected to release treatment such as silicone treatment can be used. When pressing the flat plate 10 against the curable resin material 7, the flat plate 10 and the release film 16 are bonded in advance, and the release treated surface of the release film 16 supported on the flat plate 10 is brought into contact with the curable resin material 7. When a glass plate is used as the flat plate 10, by wetting the flat plate 10 with a water spray or the like, an untreated surface of the release film 16 can be bonded by lamination, and the flat plate 10 can be easily removed from the release film 16. Alternatively, bonding and release of the release film 16 can be easily performed by cutting a groove in the flat plate 10 and adsorbing the release film 16 under reduced pressure.

Step E

Figure 7:
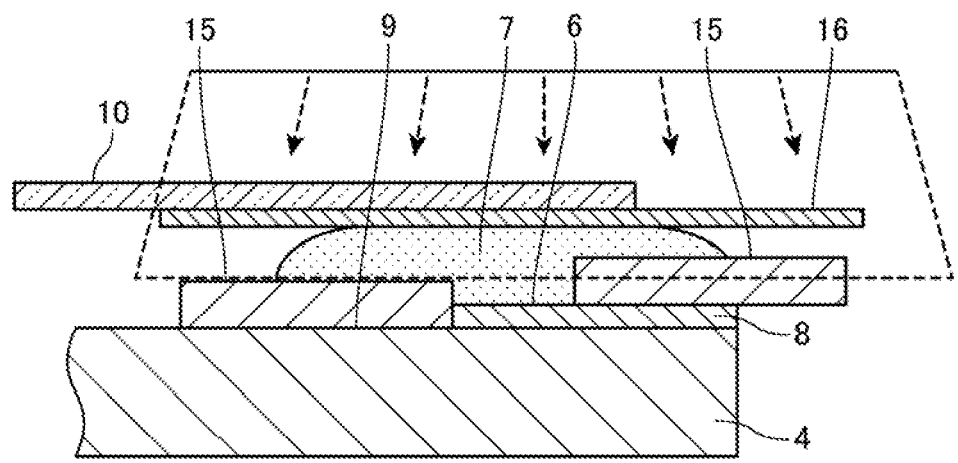
FIG. 7 is a cross-sectional view showing a step of irradiating curing light while pressing a flat plate, to which a release film is bonded, against a curable resin material.

Next, in a state where the thermosetting curable resin material 7 is pressed by the flat plate 10, the curable resin material 7 is cured to form a cured resin layer 11. In the case of using a photocurable material as the curable resin material 7, the cured resin layer 11 is formed by irradiating the curing light such as UV light through the flat plate 10, or the flat plate 10 and the release film 16 as shown in FIG. 7. In the case of using a thermosetting material as the curable resin material 7, the cured resin layer 11 is formed by heating at a predetermined temperature.

The reaction rate of the curable resin material 7 is preferably 80% or more from the viewpoint of preventing deformation and reliable breaking of the cured resin layer 11.

Step F

Figure 8:
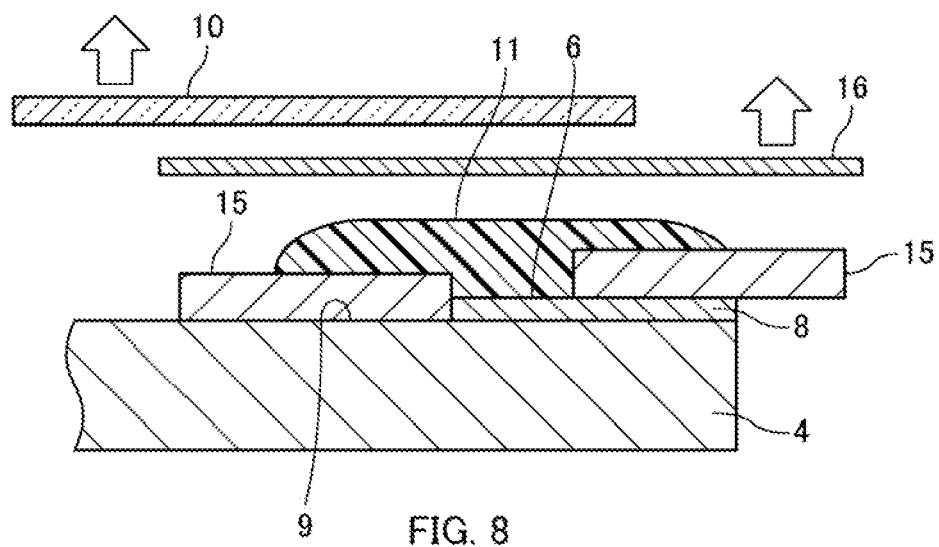
FIG. 8 is a cross-sectional view showing a step of releasing a flat plate and a release film from a cured resin layer.

Next, as shown in FIG. 8, the flat plate 10 is removed from the cured resin layer 11. At this time, by interposing the release film 16 between the flat plate 10 and the cured resin layer 11 as described above, the flat plate 10 can be easily released.

Step G

Figure 9:
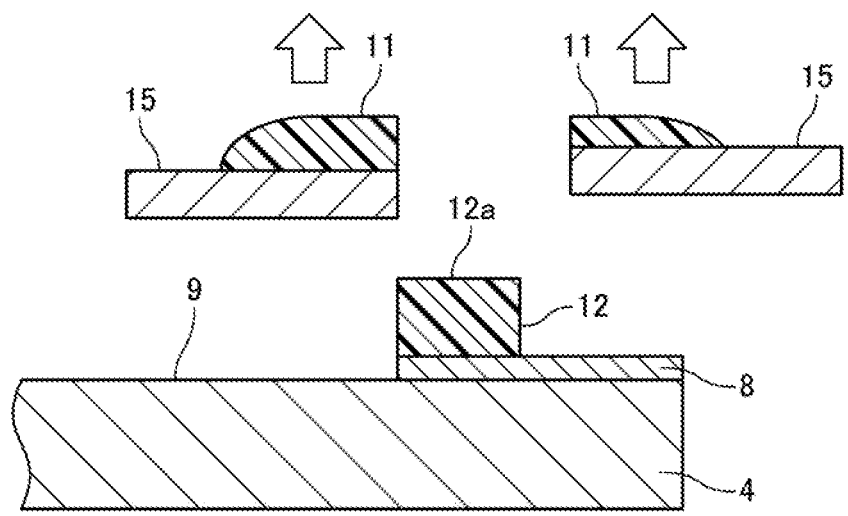
FIG. 9 is a cross-sectional view showing a step of removing the masking tape along with a cured resin layer formed on the masking tape to obtain a wall member.

Next, as shown in FIG. 9, the mask layer is removed together with the cured resin layer 11 formed on the mask layer to obtain the wall member 12 along the periphery of the outer shape of the transparent panel 4. When the masking tape 15 is used as the mask layer, the masking tape 15 is released upward with respect to the transparent panel 4. As a result, the cured resin layer 11 formed on the masking tape 15 is broken and removed from the cured resin layer 11 formed on the opening 6, and the cured resin layer 11 formed on the opening 6 remains to form the wall member 12. When the masking tape 15 is peeled off, the cured resin layer 11 on the opening 6 may be pressed by an elastic member or the like to assist the breaking of the cured resin layer 11.

Through the above steps, the transparent panel 4 having the wall member 12 erected along the periphery of the outer shape is formed. The width of the wall member 12 is defined by the width of the opening 6, and the height thereof is defined by the pressing height of the flat plate 10. The wall member 12 is cured while being pressed against the flat plate 10, whereby the upper surface 12a is formed flat.

Figure 10:
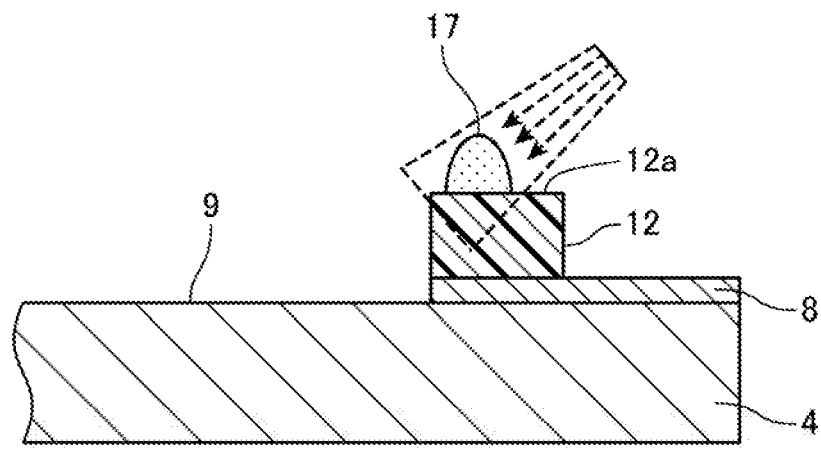
FIG. 10 is a cross-sectional view showing a step of forming a second wall member by applying a curable resin material to the upper surface of the wall member and irradiating a curing light.

In the transparent panel 4, as shown in FIG. 10, a curable resin material 7 may be further applied to the upper surface 12a of the wall member 12 and cured by light irradiation or the like to form a second wall member 17. The second wall member 17 bring the wall member 12 into close contact with the bonding surface of the optical member 2 in the bonding step with the optical member 2, and fills a minute gap therebetween. For this reason, the second wall member 17 only needs to have a shape retention property to such an extent that it does not flow out from the upper surface of the wall member 12, and the degree of curing of the wall member 12 is not necessary.

As described above, since the upper surface 12a of the wall member 12 is formed flat, the curable resin material 7 can be held without flowing, and the second wall member 17 of a desired size can be formed over the entire length of the wall member 12.

Bonding Step of the Optical Device 2

Next, an example of a bonding step of the transparent panel 4 and the optical member 2 will be described. First, as shown in FIG. 11, a curable resin composition 30 constituting the cured resin layer 3 is applied to the display portion 9 of the transparent panel 4 provided with the wall member 12. The curable resin composition 30 may be drawn in a predetermined pattern on the display portion 9 using a dispenser 31, or may be applied over the entire surface of the display portion 9. The application of the curable resin composition 30 may be performed in such a manner that a required thickness is obtained, and may be performed only once or a plurality of times.

The curable resin composition 30 applied to the display portion 9 is preferably the same material as the curable resin material 7 forming the wall member 12. By forming the wall member 12 and the cured resin layer 3 from the same material, it is possible to suppress risks such as the boundary between the wall member 12 and the cured resin layer 3 being obvious, discolored, and detached.

Figure 12:
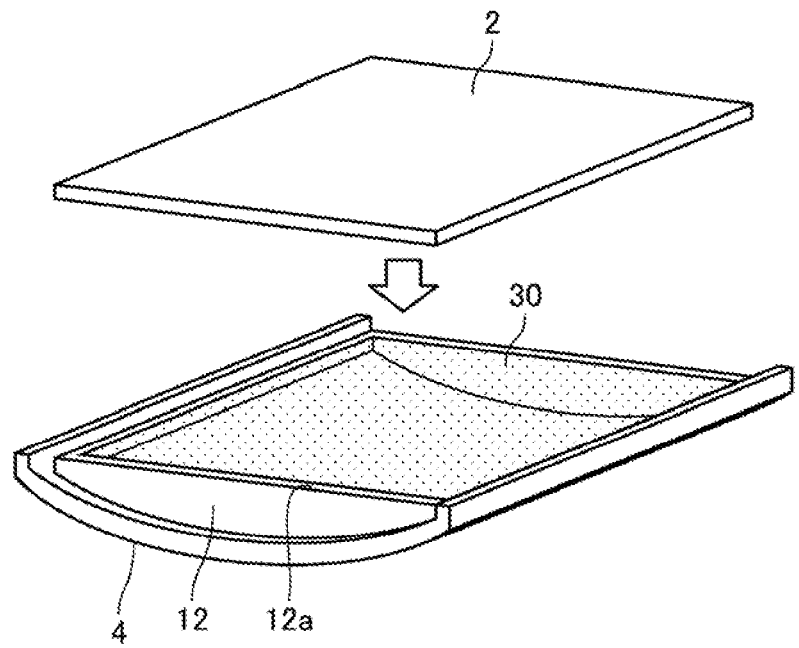
FIG. 12 is a perspective view showing a step of bonding a transparent panel to which a curable resin composition is applied and a display surface side of an optical member.

Next, as shown in FIG. 12, the transparent panel 4 applied with the curable resin composition 30 and the display surface side of the optical member 2 are bonded together. Specifically, when the transparent panel 4 and the optical member 2 are positioned at predetermined positions and joined together, the light shielding portion 8 on the transparent panel 4 is adhered to the outer periphery of the display region of the optical member 20. Thus, a laminate in which the curable resin composition 30 is held in the hollow portion surrounded by the wall member 12 is obtained.

By bonding the transparent panel 4 and the optical member 2, the curable resin composition 30 applied to the display portion 9 of the transparent panel 4 is filled between the transparent panel 4 and the optical member 2. At this time, since the wall member 12 is formed on the periphery of the transparent panel 4, the curable resin composition 30 is uniformly filled without flowing out. Further, since the upper surface 12a of the wall member 12 is formed flat, the wall member 12 has excellent adhesion to the bonding surface of the optical member 2, and leakage of the curable resin composition 30 can be prevented.

Further, by providing the above-described second wall member 17, the adhesion between the wall member 12 and the optical member 2 can be improved, and a minute gap can be filled, and even when the flexure of the transparent panel 4 or the variation in curvature occurs in the wall member 12 formed on the periphery having curvature, for example, the leakage of the curable resin composition 30 can be reliably prevented.

Next, the curable resin composition 30 is cured by irradiating curing light from the transparent panel 4 side, for example. Thus, the optical device 1 in which the transparent panel 4 is bonded to the display surface side of the optical member 2 via the cured resin layer 3 is manufactured.

The light irradiation is preferably performed so that the reaction rate (curing rate) of the cured resin layer 3 is 90% or more, more preferably 95% or more. By satisfying such a range, the visibility of the image formed on the optical member 2 can be improved.

The type, power, illuminance, and integrated light quantity, among others, of the light source used for light irradiation are not particularly limited, and for example, a known light radical polymerization process condition of (meth) acrylate by ultraviolet irradiation can be employed.

After the coating step of the curable resin composition 30, the curable resin composition 30 applied to the entire surface of the display portion 9 may be irradiated with UV light to form a precured layer. When the curable resin composition 30 is precured, the curable resin composition transits from a liquid state to a substantially nonflowable state such that, even if the transparent panel 4 is turned upside down, the curable resin composition 30 is prevented from flowing out, thereby improving handling ability.

The precuring of the curable resin composition 30 is preferably performed so that the reaction rate of the precured layer is 10 to 80%, more preferably 40 to 80%. The conditions of the light irradiation are not particularly limited as long as the reaction rate of the precured layer can be, preferably, cured to 10 to 80%.

After the precured layer is formed, as described above, the transparent panel 4 and the display surface side of the optical member 2 are bonded to each other, and the curable resin composition 30 is completely cured by irradiating curing light from the transparent panel 4 side. Thus, the optical device 1 in which the transparent panel 4 is bonded to the display surface side of the optical member 2 via the cured resin layer 3 is manufactured.

In the method for manufacturing the optical device 1, the method for bonding the transparent panel 4 and the optical member 2 is not limited to the above-described process, and various methods can be employed. For example, after the transparent panel 4 and the optical member 2 are held facing each other, the curable resin composition 30 may be filled in the hollow portion surrounded by the wall member 12.

Second Manufacturing Process

Next, second manufacturing process of the transparent panel 4 for the optical device 1 will be described. It should be noted that, in the second manufacturing process, the same members as those used in the first manufacturing process are denoted by the same reference numerals and the details thereof will be omitted.

In the second manufacturing process, a wire 20 is embedded in an end face of a mask layer forming the opening, and a cut is made in the cured resin layer 11 by removing the wire 20 before removing the mask layer. Thus, according to the second manufacturing process, the cured resin layer 11 is broken in a straight line, the width dimension of the wall member 12 can be accurately formed, and a flat side surface can be formed. Thus, the cured resin layer 11 can be formed high, and the wall member 12 having a height of, for example, 1.5 mm or more can be formed.

Hereinafter, a description will be given of a case where a wired masking tape 21 is used as a mask layer. In the wired masking tape 21, a wire 20 is embedded in an end face of an adhesive layer of the masking tape 15.

Figure 13:
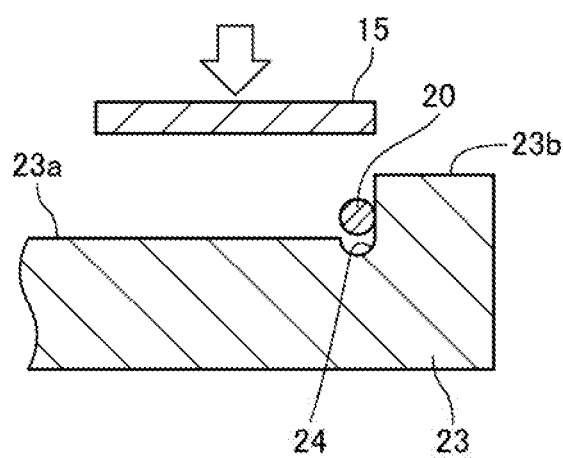
FIG. 13 is a cross-sectional view showing a step of positioning and arranging a wire on a support member and bonding a masking tape with an adhesive layer facing the support member.

The wired masking tape 21 can be formed, for example, as shown in FIG. 13, by positioning and arranging the wire 20 on a support member 23 and then laminating the masking tape 15 with the adhesive layer facing the support member 23. As the wire 20, any material which has a diameter and rigidity capable of breaking the cured resin layer 11 and does not change or color the cured resin layer 11 may be used, and for example, a piano wire having a diameter of about 0.08 mm can be used. The support member 23 is formed of a releasable resin material coated with a fluorocarbon resin such as Teflon (registered trademark), and has a support surface 23a on which the wire 20 and the masking tape 15 are arranged, and a support wall 23b for determining the positions of the wire 20 and the masking tape 15. A recess 24 into which the wire 20 is fitted may be formed in the base portion of the support wall 23b. The recess 24 has a depth shorter than the diameter of the wire 20 and positions the wire 20 to be attachable to the masking tape 15.

Figure 14:
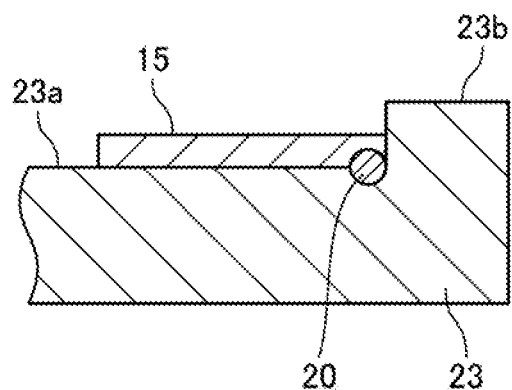
FIG. 14 is a cross-sectional view showing a step of aligning one side of the adhesive layer of the masking tape with a support wall of the support member.
Figure 15:
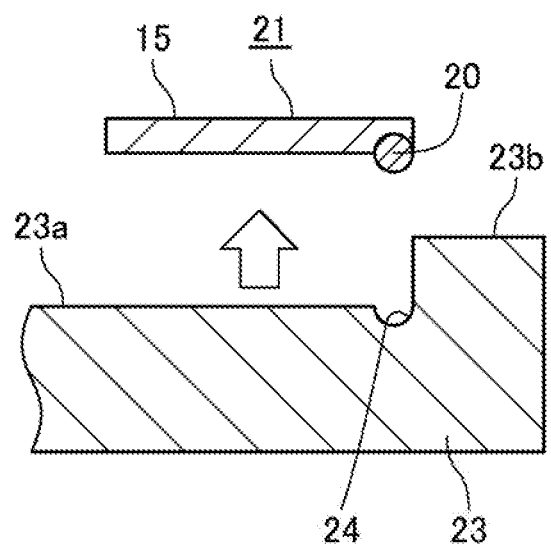
FIG. 15 is a cross-sectional view showing a step of releasing the masking tape from the support member to obtain a wired masking tape with wires embedded in the end face of the adhesive layer of the masking tape.

In order to obtain the wired masking tape 21, the wire 20 is first fitted and positioned in the recess 24 (FIG. 13), and then the adhesive layer of the masking tape 15 is arranged so that one side thereof is aligned with the support wall 23b (FIG. 14). Then, the masking tape 15 is released from the support member 23, thereby obtaining the wired masking tape 21 in which the wire 20 is embedded in the end face of the adhesive layer of the masking tape 15 (FIG. 15).

By using the wire 20 longer than the masking tape 15, the wired masking tape 21 protrudes from one or both ends of the masking tape 15, so that the wire 20 can be easily gripped and the removal step can be efficiently performed. In the case that a single masking tape 15 having a predetermined opening is used, the recess 24 of the support member 23 is formed so as to be aligned with the opening of the masking tape 15, and the wires 20 are embedded in both end faces of the opening.

Figure 17:
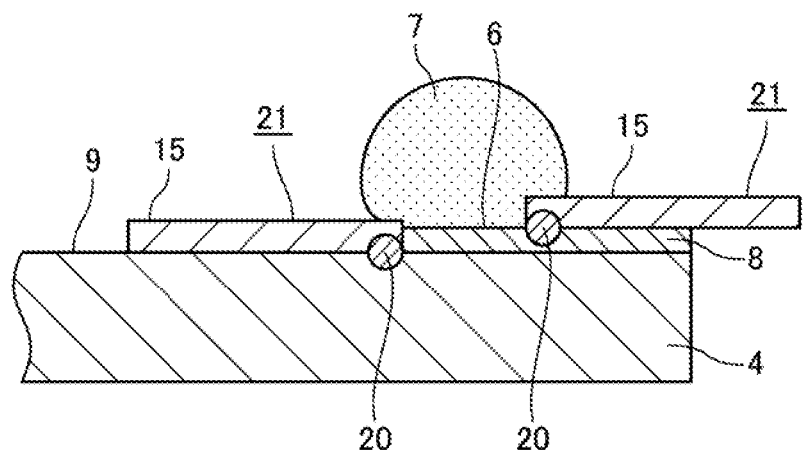
FIG. 17 is a cross-sectional view of the periphery of a transparent panel in which a curable resin material is applied to the opening and the wired masking tape.
Figure 18:
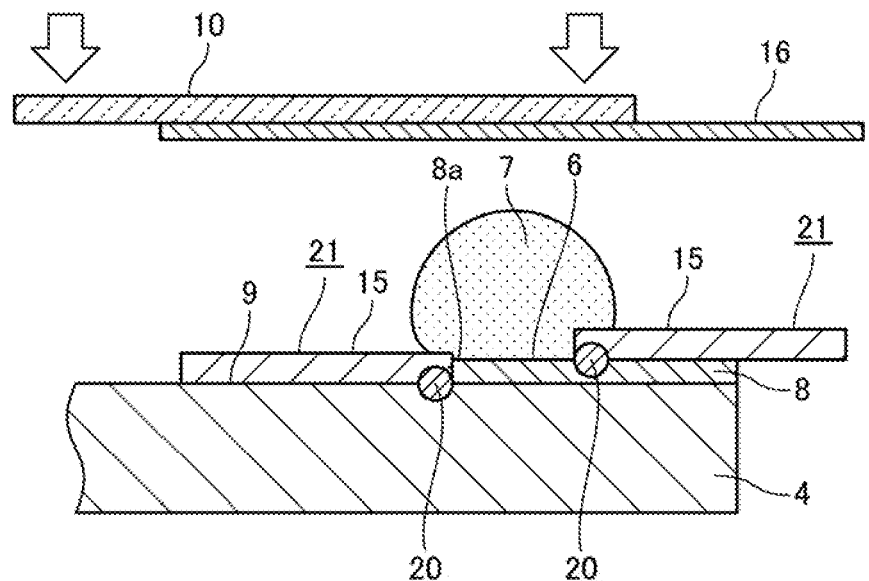
FIG. 18 is a cross-sectional view showing a step of pressing a flat plate, to which a release film is bonded, against a curable resin material.
Figure 19:
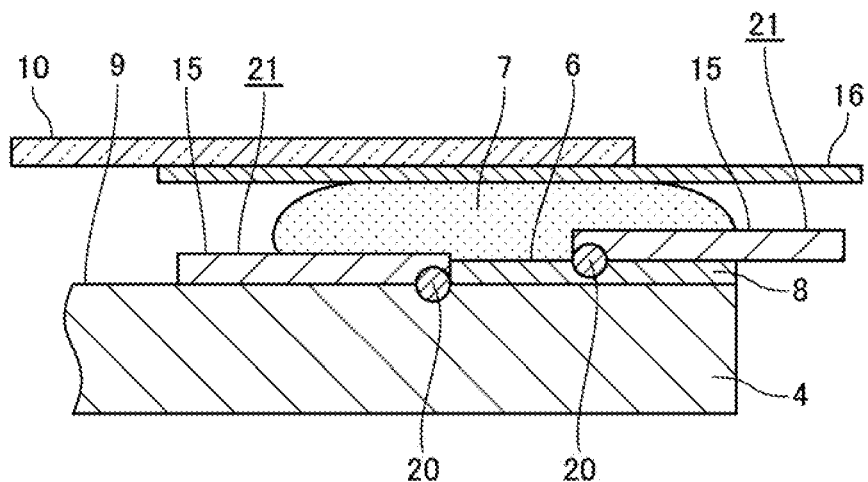
FIG. 19 is a cross-sectional view showing a state in which a flat plate, to which a release film is bonded, is pressed against a curable resin material.
Figure 20:
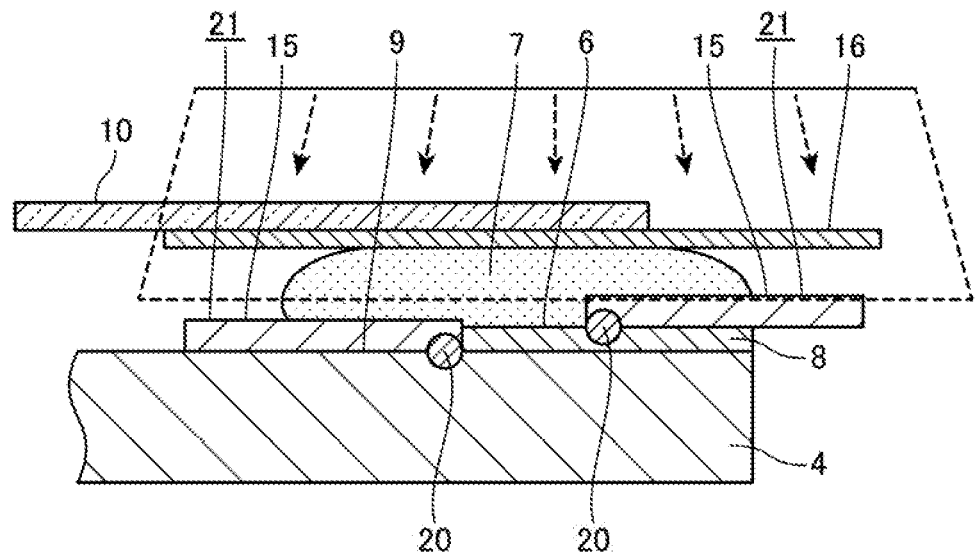
FIG. 20 is a cross-sectional view showing a step of irradiating the curing light while pressing a flat plate, to which the release film is bonded, against the curable resin material.
Figure 21:
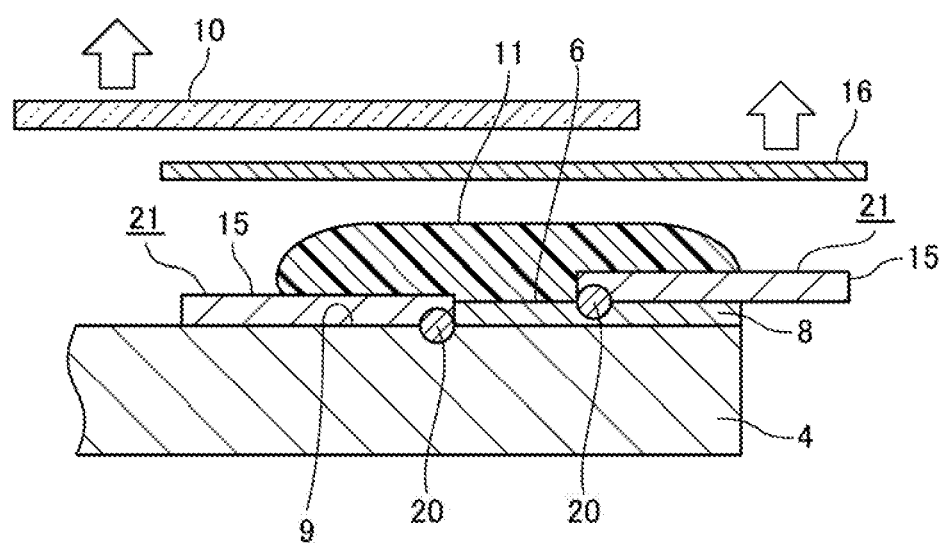
FIG. 21 is a cross-sectional view showing a step of releasing a flat plate and a release film from a cured resin layer.
Figure 23:
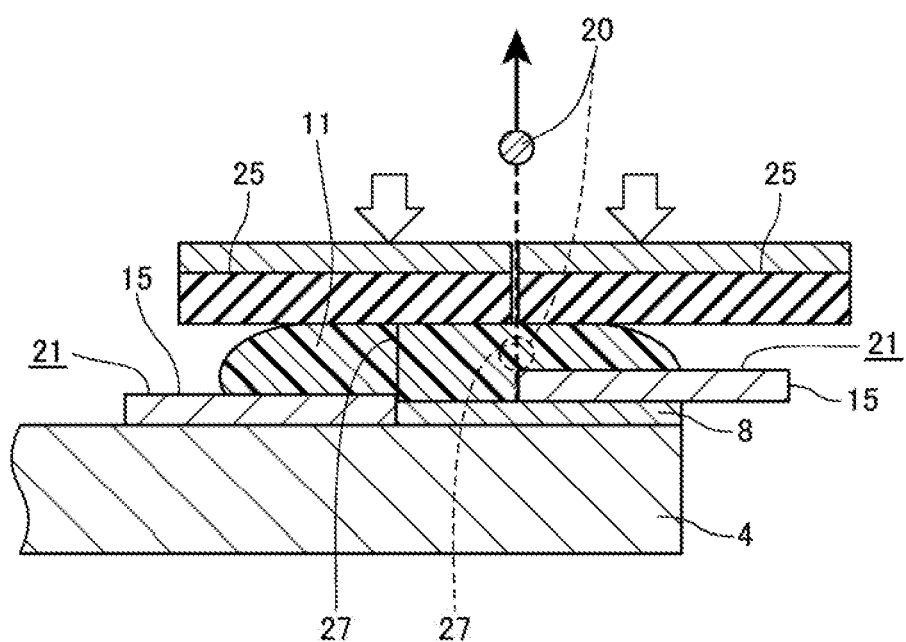
FIG. 23 is a cross-sectional view showing a step of forming a cut into the cured resin layer by removing the wire.
Figure 24:
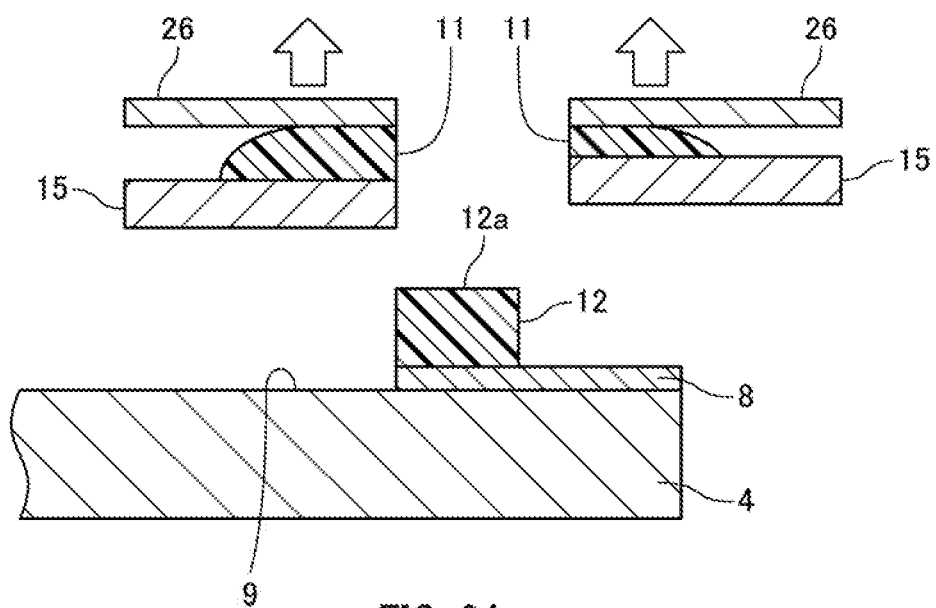
FIG. 24 is a cross-sectional view showing a step of removing a masking tape and a cured resin layer formed on the masking tape with a support of a fixing member to obtain a wall member.

The second manufacturing process using the wired masking tape 21 includes: a step (A) of preparing a transparent panel 4; a step (B) of forming a mask layer (wired masking tape 21) so as to form an opening 6 along a periphery of an outer shape of the transparent panel 4 (FIG. 16); a step (C) of applying a curable resin material 7 to the opening 6 and the mask layer (wired masking tape 21) (FIG. 17); a step (D) of pressing the flat plate 10 against the curable resin material 7 (FIGS. 18 and 19); a step (E) of curing the curable resin material 7 to form a cured resin layer 11 (FIG. 20); a step (F) of detaching the flat plate 10 (FIG. 21); and a step (H) of forming a cut 27 into the cured resin layer 11 by removing the wire 20 (FIGS. 22 and 23); a step (G) of removing the mask layer (wired masking tape 21) together with the cured resin layer 11 formed on the mask layer (wired masking tape 21) to obtain a wall member 12 along the periphery of the outer shape of the transparent panel 4 (FIG. 24).

The steps A and C to G in the second manufacturing process are the same as the steps A and C to G in the first manufacturing process described above except that a wired masking tape 21 is used instead of the masking tape 15.

Step B

Figure 16:
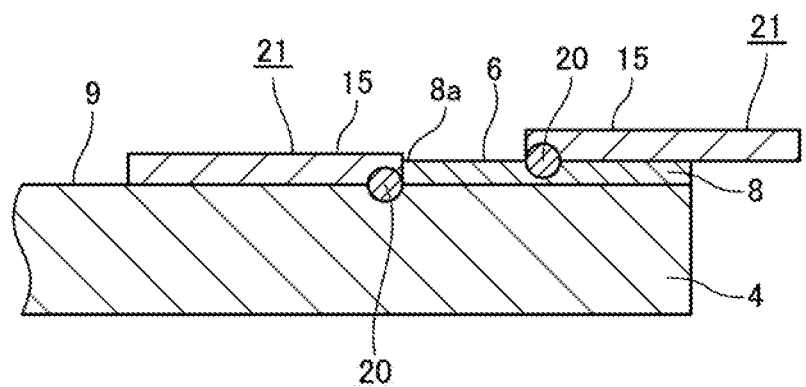
FIG. 16 is a cross-sectional view of the periphery of a transparent panel with a wired masking tape attached as a mask layer.

In the step of forming a mask layer using the wired masking tape 21, as shown in FIG. 16, the wired masking tape 21 is attached with the end portion where the wire 20 is embedded directed toward the opening 6 side. Since other matters in the step B are the same as those in the step B of the first manufacturing process described above, the details are omitted. By embedding the wires 20 in both end faces of the masking tape 15, the wired masking tape 21 can be attached in any direction.

Step H

Figure 22:
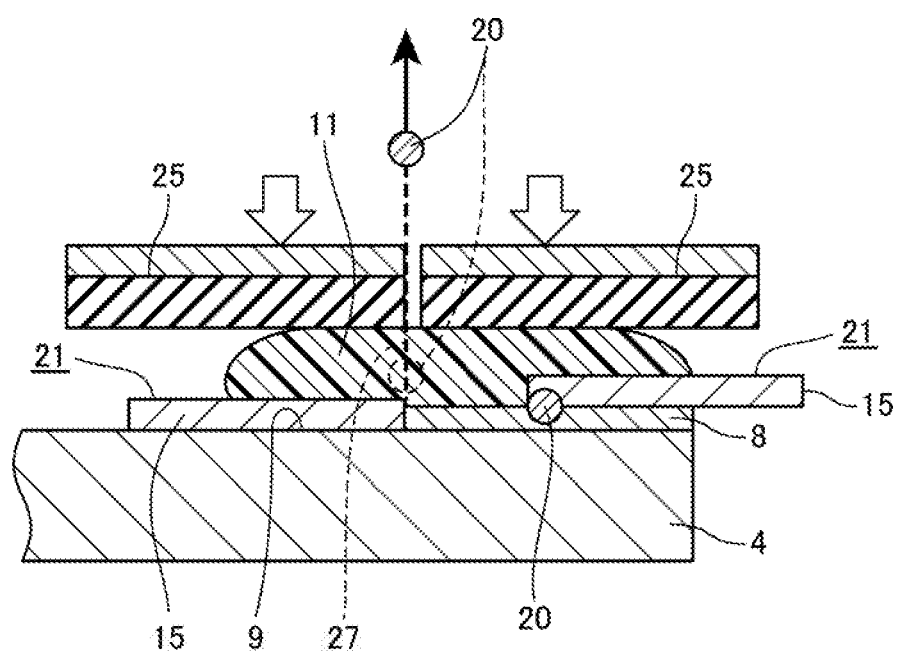
FIG. 22 is a cross-sectional view showing a step of forming a cut into the cured resin layer by removing the wire.

In the second manufacturing process, after the cured resin layer 11 is formed and the flat plate 10 is removed, as shown in FIGS. 22 and 23, the wire 20 is removed to form a cut 27 into the cured resin layer 11. The wire 20 is removed from the end face of the masking tape 15 by pulling out from the longitudinal end of the masking tape 15 and pulling up above the transparent panel 4, breaking the cured resin layer 11 upward along the gap between the opening 6 and the end face of the masking tape 15.

At this time, it is preferable to hold the cured resin layer 11 on the opening 6 and the masking tape 15 with a pressing member 25 such as silicon rubber. Thus, both sides of the cured resin layer 11 to be broken by the wire 20 can be fixed, and even the cured resin layer 11 having a high height can be broken upwardly in a straight line without being swung from side to side.

In the step G of removing the masking tape 15 and the cured resin layer 11 formed on the masking tape 15, as shown in FIG. 24, the upper surface of the cured resin layer 11 on the masking tape 15 may be supported by a fixing member 26 such as silicon rubber. Thus, even when the wall member 12 having a height is formed, the cured resin layer 11 on the masking tape 15 can be removed smoothly without damaging the wall member 12.

It should be noted that, in the transparent panel 4 formed through the second manufacturing process, as shown in FIG. 10, a curable resin material 7 may be further applied to the upper surface 12a of the wall member 12 and cured by light irradiation or the like to form a second wall member 17.

The transparent panel 4 formed by the second manufacturing process is subjected to the aforementioned bonding step with the optical member 2, whereby the optical device 1 is manufactured.

REFERENCE SIGNS LIST 1 optical device, 2 optical member, 3 curable resin layer, 4 transparent panel, 6 opening, 7 curable resin material, 8 light shielding portion, 9 display, 10 flat plate, 11 cured resin layer, 12 wall member, 12 upper surface, 15 masking tape, 16 release film, 17 second wall member, 20 wire, 21 wired masking tape, 23 support member, 23a support surface, 23b support wall, 24 recess, 25 pressing member, 26 fixing member, 27 cut, 30 curable resin composition

The invention claimed is:

1. A method for manufacturing a transparent panel comprising:
   a step of preparing a transparent panel for an optical device to be bonded to an optical member;
   a step of forming a mask layer so as to form an opening along a periphery of an outer shape of the transparent panel;
   a step of applying a curable resin material to the opening and the mask layer;
   a step of pressing a flat plate against the curable resin material;
   a step of curing the curable resin material to form a cured resin layer;
   a step of detaching the flat plate; and
   a step of removing the mask layer in its entirety, comprising breaking the cured resin layer such that a portion of the cured resin layer formed on the mask layer is removed with the mask layer, and a portion of the cured resin layer not formed on the mask layer is not removed and forms a wall member on the opening along the periphery of the outer shape of the transparent panel.

2. The method for manufacturing a transparent panel according to claim 1, wherein the flat plate is a transparent plate and the step of curing the curable resin material is conducted by irradiating ultraviolet-rays through the transparent plate.

3. The method for manufacturing a transparent panel according to claim 1, wherein the mask layer is a masking tape.

4. The method for manufacturing a transparent panel according to claim 3, wherein the opening is formed by attaching a plurality of the masking tapes along the periphery of the outer shape of the transparent panel with a gap therebetween.

5. The method for manufacturing a transparent panel according to claim 3, wherein the opening is formed by attaching a masking tape having a predetermined opening along the periphery of the outer shape of the transparent panel.

6. The method for manufacturing a transparent panel according to claim 3, wherein the wall member is obtained by releasing the mask layer upward with respect to the transparent panel.

7. The method for manufacturing a transparent panel according to claim 1, wherein the transparent panel has a light shielding layer formed along the periphery of the outer shape, and the wall member is provided on the light shielding layer.

8. The method for manufacturing a transparent panel according to claim 1, wherein a second wall member is formed on an upper surface of the wall member.

9. The method for manufacturing a transparent panel according to claim 1, wherein the transparent panel is a curved panel having a curvature along at least a periphery along which the wall member is formed.

10. A method for manufacturing an optical device comprising:
a step of holding a transparent panel manufactured by using a method according to claim 1 and an optical member so as to face each other, bringing the wall member into close contact with a bonding surface of the optical member, and obtaining a laminate in which a curable resin composition is held in a hollow portion surrounded by the wall member; and
a step of curing the curable resin composition.

11. The method for manufacturing an optical device according to claim 10, wherein after the curable resin composition is supplied to a surface of the transparent panel on which the wall member is formed and/or a bonding surface of the optical member, the transparent panel and the optical member are held facing each other.

12. The method for manufacturing an optical device according to claim 10, wherein the hollow portion is filled with the curable resin composition after the transparent panel and the optical member are held facing each other.

13. The method for manufacturing a transparent panel according to claim 1, wherein the wall member has a same width as the opening.

14. The method for manufacturing a transparent panel according to claim 1, wherein the wall member comprises the cured resin.

15. The method for manufacturing a transparent panel according to claim 1, wherein the opening is an opening formed in the mask layer.

16. The method for manufacturing a transparent panel according to claim 1, wherein in the step of applying a curable resin material to the opening and the mask layer, the curable resin contacts both the opening and a surface of the mask layer.

17. The method for manufacturing a transparent panel according to claim 1, wherein the mask layer and the opening are present on at least two opposing sides of the periphery of the outer shape of the transparent panel.

18. The method for manufacturing a transparent panel according to claim 1, wherein the wall member is configured so as to prevent the curable resin material from protruding, and wherein the wall member does not protrude into a display region of the optical member.

19. A method for manufacturing a transparent panel comprising: a step of preparing a transparent panel for an optical device to be bonded to an optical member;
a step of forming a mask layer so as to form an opening along a periphery of an outer shape of the transparent panel;
a step of applying a curable resin material to the opening and the mask layer;
a step of pressing a flat plate against the curable resin material;
a step of curing the curable resin material to form a cured resin layer;
a step of detaching the flat plate; and
a step of removing the mask layer together with the cured resin layer formed on the mask layer to obtain a wall member along the periphery of the outer shape of the transparent panel;
wherein a wire is embedded in an end face of the mask layer forming the opening, and
wherein a cut is formed in the cured resin layer by removing the wire before removing the mask layer.

20. The method for manufacturing a transparent panel according to claim 19, wherein the cut is obtained by releasing the wire upward with respect to the transparent panel.

21. The method for manufacturing a transparent panel according to claim 19, wherein a second wall member is formed on an upper surface of the wall member.

22. The method for manufacturing a transparent panel according to claim 19, wherein the transparent panel is a curved panel having a curvature along at least a periphery along which the wall member is formed.

* * * * *